United States Patent
Tan et al.

(10) Patent No.: US 8,985,935 B2
(45) Date of Patent: Mar. 24, 2015

(54) MASS DAMPER FOR SEMICONDUCTOR WAFER HANDLING END EFFECTOR

(71) Applicant: Novellus Systems, Inc., Fremont, CA (US)

(72) Inventors: Mark K. Tan, San Jose, CA (US); Nicholas M. Kopec, Sunnyvale, CA (US); Richard M. Blank, San Jose, CA (US)

(73) Assignee: Novellus Systems, Inc., Fremont, CA (US)

( * ) Notice: Subject to any disclaimer, the term of this patent is extended or adjusted under 35 U.S.C. 154(b) by 127 days.

(21) Appl. No.: 13/757,489

(22) Filed: Feb. 1, 2013

(65) Prior Publication Data

US 2013/0213169 A1 Aug. 22, 2013

Related U.S. Application Data

(60) Provisional application No. 61/600,515, filed on Feb. 17, 2012.

(51) Int. Cl.

| B25J 19/00 | (2006.01) |
|---|---|
| F16F 7/10 | (2006.01) |
| B25J 18/00 | (2006.01) |
| B25J 15/00 | (2006.01) |
| F16F 15/10 | (2006.01) |
| B25J 11/00 | (2006.01) |
| H01L 21/67 | (2006.01) |
| H01L 21/687 | (2006.01) |

(52) U.S. Cl.
CPC . *F16F 7/10* (2013.01); *B25J 18/00* (2013.01); *B25J 15/00* (2013.01); *F16F 15/10* (2013.01); *B25J 11/0095* (2013.01); *H01L 21/67196* (2013.01); *H01L 21/67201* (2013.01); *H01L 21/68707* (2013.01); *Y10S 901/30* (2013.01)
USPC ........................................ 414/744.1; 901/30

(58) Field of Classification Search
CPC ...... B25J 19/0008; B25J 19/002; B25J 15/00; B25J 18/00; F16F 7/10
USPC ........................................ 414/744.1; 901/30
See application file for complete search history.

(56) References Cited

U.S. PATENT DOCUMENTS

| 2,736,393 | A | | 2/1956 | O'Connor | |
|---|---|---|---|---|---|
| 4,382,587 | A | | 5/1983 | Heinrich et al. | |
| 5,004,399 | A | * | 4/1991 | Sullivan et al. | ................. 901/30 |
| 5,102,289 | A | * | 4/1992 | Yokoshima et al. | ........ 414/744.2 |
| 6,091,574 | A | * | 7/2000 | Misso | ......................... 360/265.9 |
| D441,730 | S | | 5/2001 | Oba | |
| 6,508,343 | B2 | | 1/2003 | Misaji et al. | |
| 6,758,113 | B2 | * | 7/2004 | Choy et al. | ..................... 414/719 |
| 6,761,085 | B1 | * | 7/2004 | Tan | ............................... 414/935 |
| 6,976,400 | B1 | * | 12/2005 | Tan | ............................... 414/935 |
| 7,461,728 | B2 | | 12/2008 | Huston et al. | |
| 7,724,479 | B2 | * | 5/2010 | Nguyen et al. | ............. 360/265.9 |
| 8,059,259 | B2 | | 11/2011 | Butler et al. | |
| 8,462,510 | B2 | | 6/2013 | Lin et al. | |
| 2009/0122284 | A1 | * | 5/2009 | Butler et al. | .................. 188/378 |

* cited by examiner

*Primary Examiner* — Gerald McClain
(74) *Attorney, Agent, or Firm* — Weaver Austin Villeneuve & Sampson

(57) ABSTRACT

A calibrated mass damper for use with end effectors for semiconductor wafer handling robots is described. The calibrated mass damper reduces vibrational response in an end effector carrying a semiconductor wafer without requiring modification of the end effector structure.

19 Claims, 10 Drawing Sheets ced to the process chambers by wafer handling systems that are mechanically coupled to the process chambers. The wafer handling systems transfer wafers from the factory floor to the process chamber. The wafer handling systems may include load locks to bring the wafers from atmospheric conditions to very low pressure conditions and back, and robotic arms equipped with end effectors configured to support the wafers during wafer transport.

SUMMARY

The techniques and devices disclosed herein may be implemented in a variety of ways, including, but not limited to, the various implementations described below. It is to be understood that one of ordinary skill in the art may use the techniques and devices described herein to produce other implementations consistent with the information disclosed in this document, and that such alternative implementations are also to be considered as within the scope of this disclosure.

In one implementation, a device is provided which includes a mechanical interface configured to rigidly connect to an end effector of a wafer handling robot, the end effector configured to support a wafer, The device may also include a calibrated mass damper (CMD) with a weight of more than 0.38 lbm, and may be calibrated to produce at least one octave of separation between the first modal frequency of the end effector and the first modal frequency of the wafer that the end effector is configured to support.

In some further implementations, the CMD may be approximately 0.42 pound-mass. In some implementations, tungsten may be used to make the CMD. The CMD may also be plated, for example, with nickel.

In some further implementations, the end effector may have a first length in a direction corresponding to the largest dimension of the end effector, and the CMD and the end effector, when the CMD is installed on the end effector, may have a combined second length in the direction corresponding to the largest dimension of the end effector. In such implementations, the second length may not exceed the first length by more than 1.35".

In some implementations, the CMD may include a housing and a calibration material. The calibration material may be a granulated material which is sealed within the housing.

In another implementation, an end effector retrofit kit may be provided. The end effector retrofit kit may include a calibrated mass damper (CMD). The CMD may include a mechanical interface configured to rigidly connect to the end effector of a wafer handling robot, the end effector may, in turn, be configured to support a wafer. The CMD may have a weight of more than 0.38 lbm, and may be calibrated to produce at least one octave of separation between the first modal frequency of the end effector and the first modal frequency of the wafer that the end effector is configured to support.

In some further end effector retrofit kit implementations, the kit may further include a standard CMD contact pad. The end effector may include one or more standard contact pads, and the standard CMD contact pad may be configured to replace one of the standard contact pads of the end effector during retrofit. The standard CMD contact pad may also include a subset of the features of the standard contact pad, as well as additional features configured to interface with and support the CMD.

In some further end effector retrofit kit implementations, the kit may further include a backside CMD contact pad. The end effector may include one or more backside contact pads, and the backside CMD contact pad may be configured to replace one of the backside contact pads of the end effector during retrofit. The backside CMD contact pad may also include a subset of the features of the backside contact pad, as well as additional features configured to interface with and support the CMD.

In some further end effector retrofit kit implementations, the kit may further include a modified arm. The modified arm may be configured to replace an existing arm of the wafer handling robot during retrofit. The existing arm may permit a first level of pitch adjustment for the end effector. The modified arm may include features configured to rigidly interface with mating features on the end effector, rigidly interface with mating features on a carriage of the robot, and permit a second level of pitch adjustment for the end effector which is greater than the first level of pitch adjustment provided by the existing arm.

In some further end effector retrofit kits, the end effector may have a first length in a direction corresponding to a largest dimension of the end effector, the CMD and the end effector, when the CMD is installed on the end effector, may have a combined second length in the direction corresponding to the largest dimension of the end effector, and the second length may not exceed the first length by more than 1.35".

The CMD used in a retrofit kit may be implemented as described above in the device implementation.

In one implementation, an end effector may be provided. The end effector may include a mechanical interface portion, a first side of the mechanical interface portion configured to rigidly connect to an arm of a wafer handling robot. The end effector may also include a finger portion, the finger portion extending from the mechanical interface portion in a direction generally opposed to the first side, and a tip, the tip located at an end of the finger portion opposite the mechanical interface portion. The end effector may be configured to support a semiconductor wafer during wafer transfer operations. The end effector may also include a calibrated mass damper (CMD) as described above. The CMD may be proximate to the tip.

In some implementations, a technique for reducing vibration in a wafer being moved on an end effector is provided. The technique may include separating the resonant frequency of the wafer from the resonant frequency of the end effector by at least one octave such that the resonant frequency of the end effector is always lower than the resonant frequency of the wafer. In some implementations, the resonant frequencies of the wafer and the end effector may be separated by installing a CMD on the end effector.

Details of one or more implementations of the subject matter described in this specification are set forth in the

DRAWINGS

While FIGS. 1A-6E are drawn to scale, this disclosure should not be interpreted to be limited to structures such as those shown in FIGS. 1A-6E. Other configurations and geometries may be produced which satisfy the concepts outlined herein, and should be viewed as falling within the scope of this disclosure.

DETAILED DESCRIPTION

Examples of various embodiments are illustrated in the accompanying drawings and described further below. It will be understood that the discussion herein is not intended to limit the claims to the specific embodiments described. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well-known process operations have not been described in detail in order not to unnecessarily obscure the present invention.

Figure 1A:
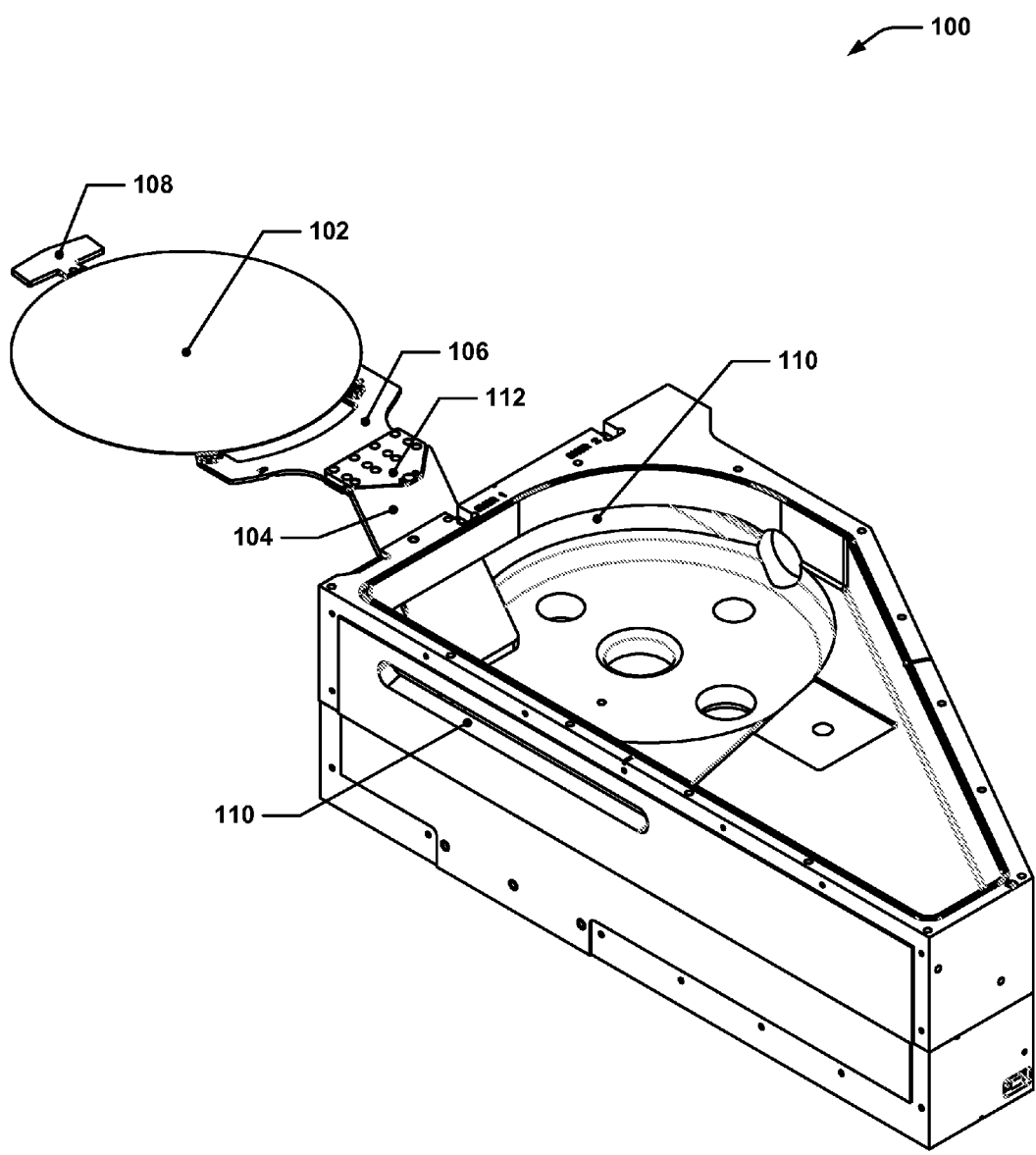
FIG. 1A depicts an isometric view of a load lock and a robot arm transfer mechanism.

FIG. 1A depicts a load lock 100, which may be used to transfer a wafer 102 between environments of different pressures, e.g., from atmospheric or near atmospheric conditions to low-pressure, near-vacuum, or vacuum conditions within a semiconductor fabrication chamber. The load lock 100 is not shown with all components attached. For example, a cover which would normally be affixed to the top of load lock 100 is not depicted to allow the interior of load lock 100 to be seen. Wafer ports 110 may allow the wafer to be introduced to, and withdrawn from, the load lock 100.

The load lock 100 may include an arm 104, which may be rigidly connected to a carriage which is, in turn, connected to a carriage interface configured for linear movement (not shown). The carriage interface may allow the arm 104 to be translated along a single axis, e.g., an axis parallel to the longest edge of the load lock 100 in this example, to allow arm 104 to be extended from, and retracted into, load lock 100.

An end effector 106 may be connected to the end of the arm 104. This allows a variety of different end effectors to be used with a single model of the load lock 100; it also allows for easy replacement of damaged or worn out end effectors. An end effector clamp 112 may be used to secure the end effector 106 to the arm 104, although other techniques or securement mechanisms may be used in place of the end effector clamp 112. The end effector 106 may be sized for a particular wafer size, e.g., a 300 mm diameter wafer.

Figure 1B:
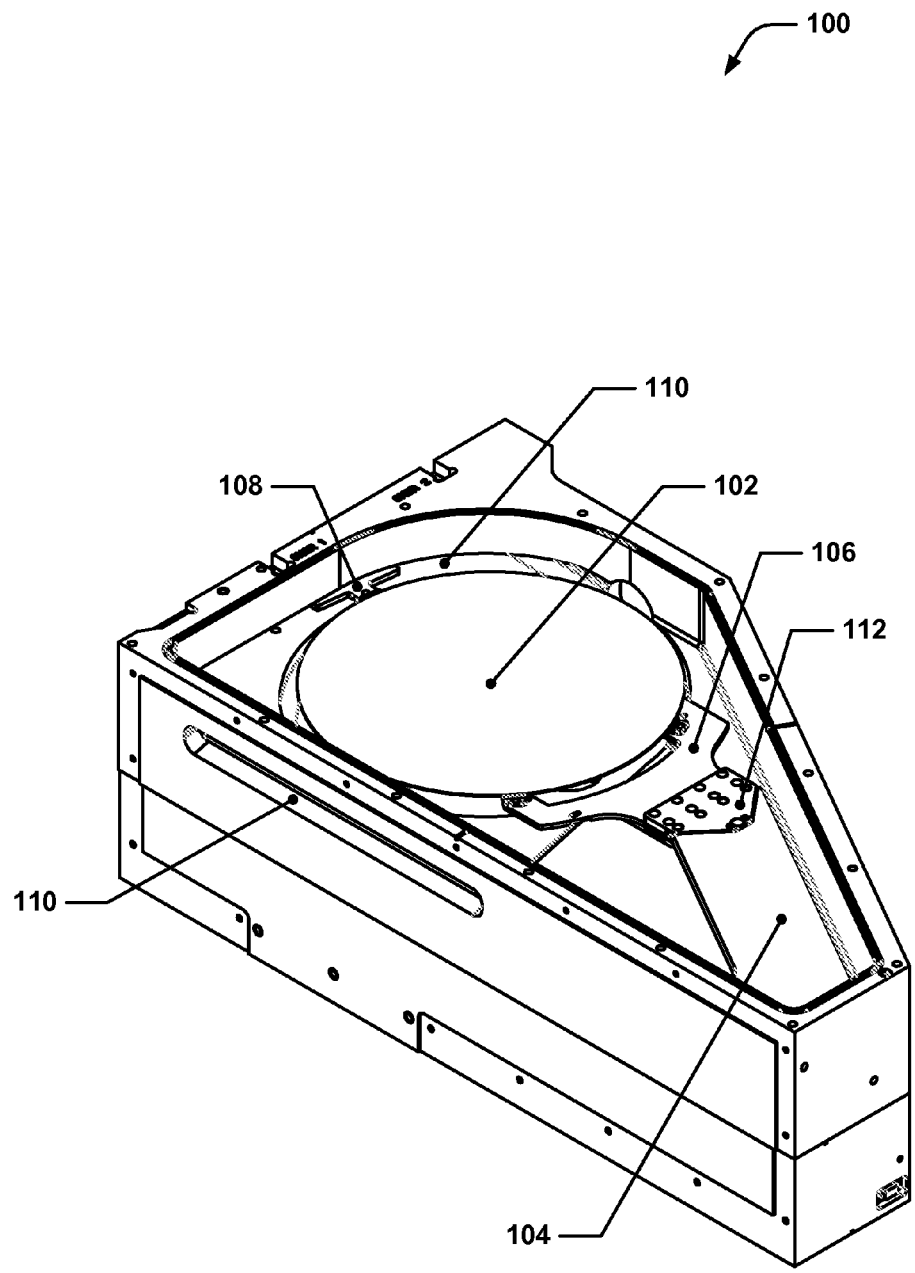
FIG. 1B depicts an isometric view of the load lock of FIG. 1A with the robot arm retracted.

Also visible in FIG. 1A is calibrated mass damper (CMD) 108, which may be affixed to the tip of the end effector 106. FIG. 1B depicts the load lock 100 with the arm 104 retracted and the wafer 102 withdrawn into the interior of the load lock 100.

Figure 2:
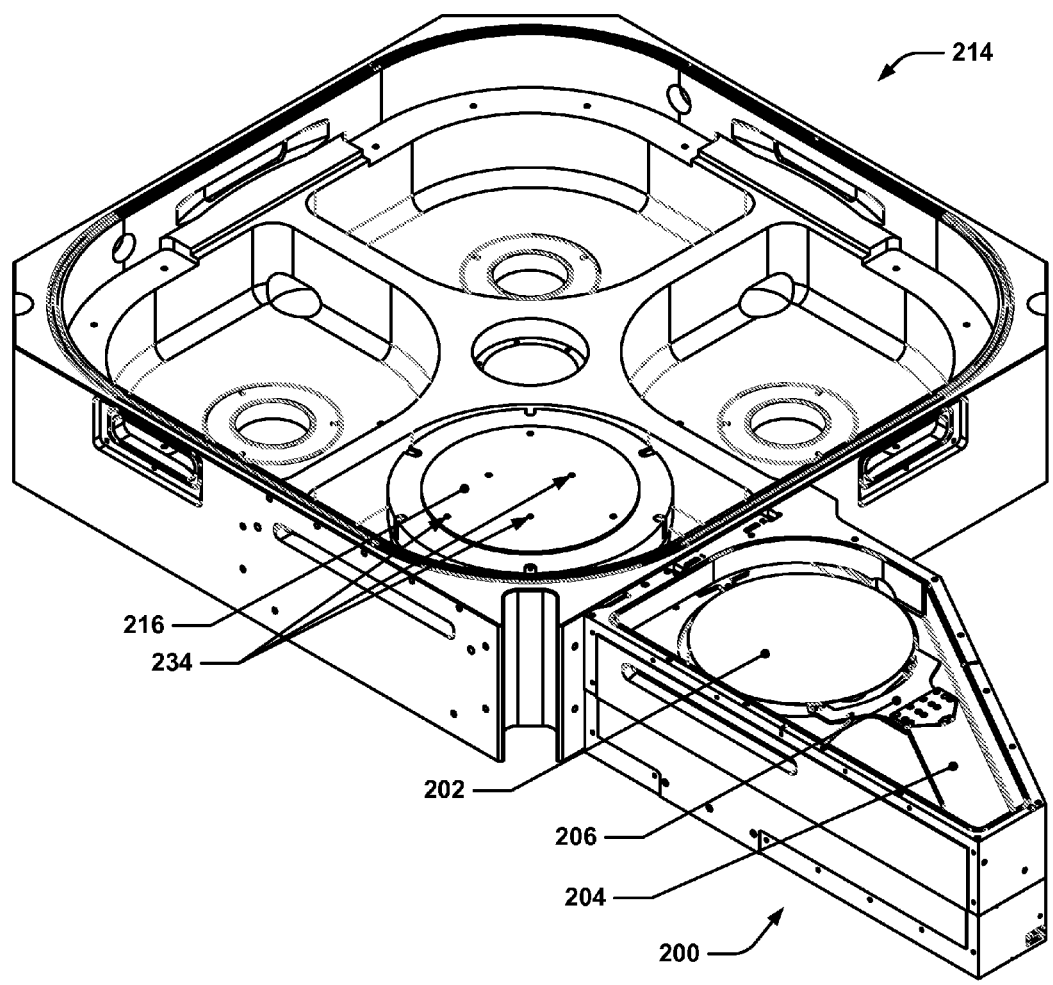
FIG. 2 depicts an isometric view of a load lock transfer mechanism attached to a semiconductor fabrication chamber.

FIG. 2 depicts a load lock 200 connected to a semiconductor process chamber 214, which is shown with most components removed for clarity. Also visible in FIG. 2 is a pedestal 216, which may be used to receive the wafer 202 when the arm 204 with the end effector 206 is extended to place the wafer 202 in the semiconductor process chamber 214. Lift pins 234 may extend vertically out of the pedestal 216 and lift the wafer 202 off of the end effector 206. When the wafer 202 is lifted off of the end effector 206, the arm 204 may be retracted into the load lock 200 and readied to receive another wafer 202. Such procedures may also be performed in reverse, i.e., the wafer 202 may be lifted off of the pedestal 216 by the lift pins 234, the arm 204 may be extended out of the load lock 200 to place the end effector 206 under the wafer 202, and the lift pins 234 may then retract and lower the wafer 202 onto the end effector 206. The arm 204 may then retract into the load lock 200, transferring the wafer 202 out of the semiconductor process chamber.

While not depicted, other pedestals similar to the pedestal 216 may be located in other stations within the semiconductor process chamber 214. A robot capable of rotational movement (not shown), e.g., an R-theta robot, may be used to transfer wafers from station to station within the semiconductor process chamber. Such a robot may also use end effectors similar to those described herein, and may benefit from similar CMDs.

Figure 3A:
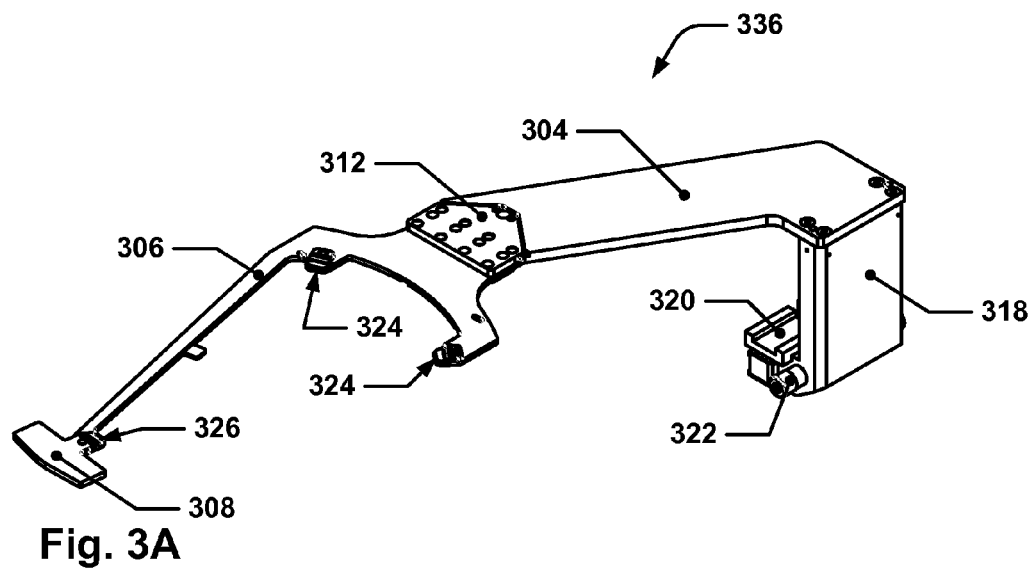
FIG. 3A depicts an isometric view of an arm, end effector, and carriage.

FIG. 3A depicts an arm 304, an end effector 306, and other associated components, some of which are obscured from view in FIGS. 1A-BB, which form an arm assembly 336. The arm 304 may be connected to a carriage 318, which may be, in turn, connected to a carriage interface 320. The carriage interface 320 may, when installed in a load lock or other piece of equipment, engage with a rail or other linear guide/drive device (not shown). While the movement of the carriage interface 320 may be controlled by a motion controller associated with the load lock, bumpers 322 may be used to prevent sharp impacts with the interior walls of the load lock should the carriage interface travel too far along the linear guide/drive device.

The end effector 306 may be connected to the opposite end of the arm 304 by an end effector clamp 312 and/or other components (not shown). A calibrated mass damper (CMD) 308 may be attached to the end effector 306, for example, at the tip of the end effector 306. Also visible in FIG. 3A are contact pads 324 and CMD contact pad 326, which are attached to the base and tip of the end effector 306, respectively.

Figure 3B:
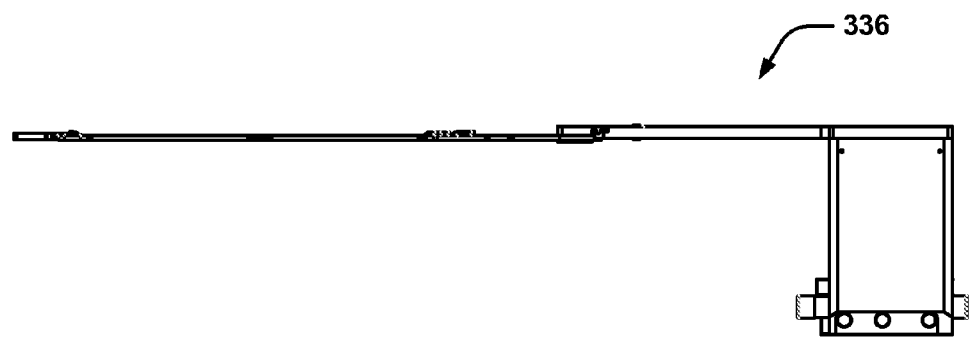
FIG. 3B depicts the arm, end effector, and carriage from a side view.

FIG. 3B depicts a side view of the arm assembly 336. As can be seen, much of the arm assembly 336 may be very thin and generally planar. This allows, for example, the end effector 306 to be inserted through openings having limited vertical clearance, such as, for example, the wafer ports 110 in FIGS. 1A and 1B or the gap between wafer 102 and pedestal 116 when the wafer 102 is lifted off of the pedestal 116 by the lift pins 134.

The end effectors 306 may be relatively simple in design due to environmental and contamination constraints of the environments in which they operate. For example, the end effectors 306 may be exposed to vacuum or near-vacuum environments, which may preclude the use of various mechanisms. For example, the end effector 306 may be configured to restrict motion of a wafer with respect to itself by using friction or mechanical stops. Other technologies, such as vacuum clamping mechanisms, may be ineffective in a vacuum environment due to the relative absence of atmospheric pressure (which supplies the clamping force of a vacuum clamp). Mechanical grippers or other kinematic mechanisms may be similarly unsuited for use in such environments since they may include lubricated surfaces, and such lubricants would contaminate the process environment. Kinematic mechanisms may also generate particulates which may further contaminate the process environment. The end effectors may also need to be compatible with high temperatures and corrosive environments.

Figure 4:
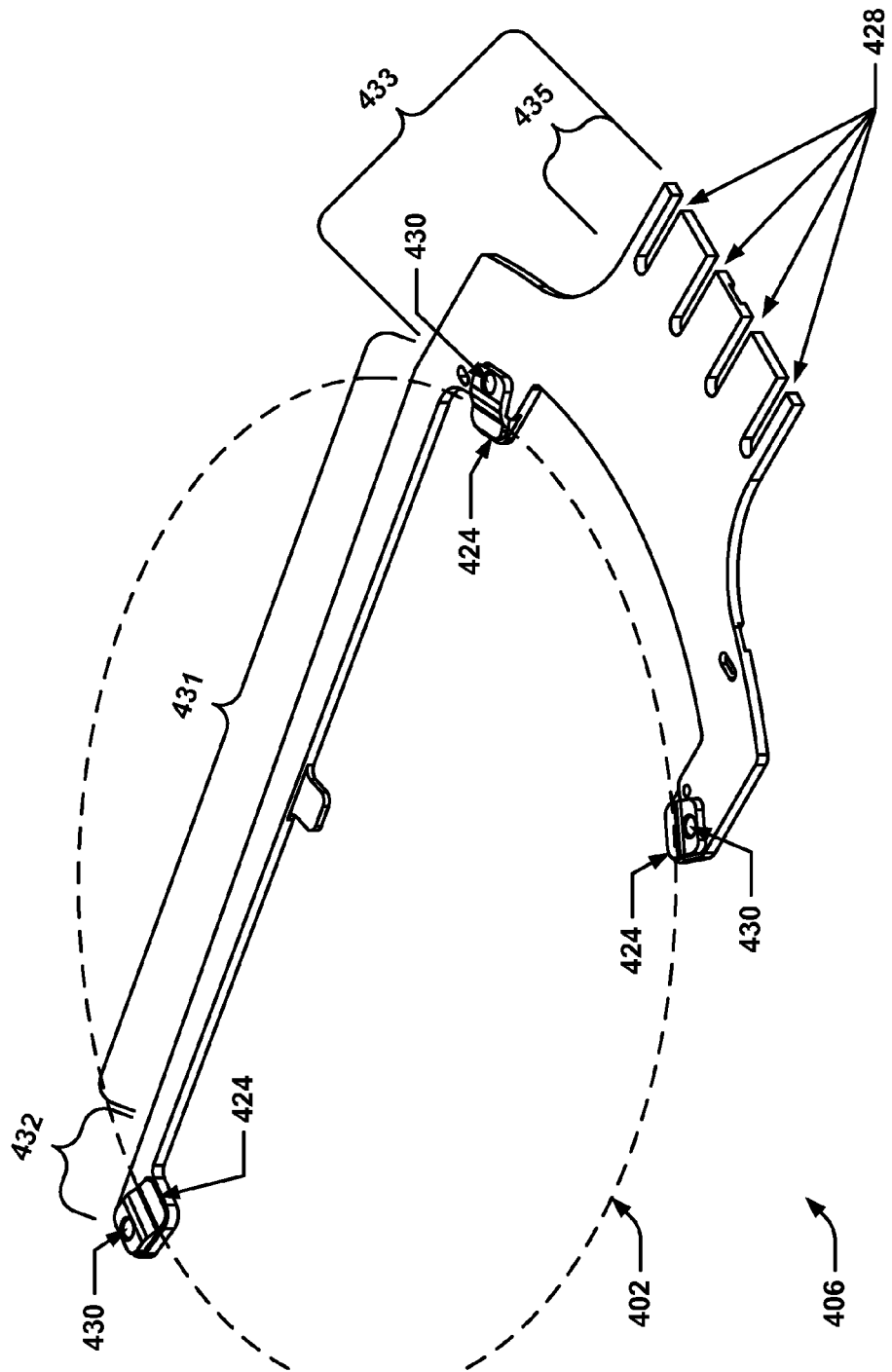
FIG. 4 depicts an isometric view of an end effector.

FIG. 4 depicts an end effector 406 (without a CMD) which has a hook shape and which includes three contact pads 424. The contact pads 424 may be generally located along a reference circle such that the contact surfaces of the contact pads engage with the edge region of the wafer (indicated by dashed wafer outline 402) during wafer transport, which allows the wafer to be stably supported at three points. Several screws 430 may be used to fasten the contact pads 424 to the end effector 406. The end effector 406 may include slots 428 or other features which allow the end effector 406 to be mounted to an arm or other mechanism. The end effector 406 and the contact pads 424 may be, for example, made from aluminum and alumina, respectively, although other materials which are compatible with process environments may be used as well. For example, the contact pads 424 may be made from metals such as stainless steel or aluminum or from polymers such as PEEK or PET, and the end effector 406 may be made from stainless steel, molybdenum, or alumina.

The end effector 406 may, for example, have a nominal thickness of approximately 0.15", and be approximately 16" in length. The finger portion (indicated by 431) of end effector 406 which leads from the tip 432 to the interface portion 433 of end effector 406 which features slots 428 in a first side 435 of the interface portion 433 may be long and thin, and may include a taper. For example, such a finger portion may be approximately 0.4" wide near the tip 432, 0.6" wide near the slot portion, and 10.3" long. Such an end effector 406 may be used to handle wafers with a 300 mm nominal diameter. End effectors with other dimensions may be used to handle other sizes of wafers.

While friction or mechanical stops offer a simple and reliable way to support a wafer, such techniques generally do allow for the possibility of some wafer movement with respect to the end effector. For example, rapid movement of the end effector supporting a wafer using contact pads to provide a friction support may cause the wafer to slip relative to the end effector if the inertia of the wafer overcomes the friction provided via the contact pads. In cases of severe acceleration, the wafer may even slip off of the end effector entirely. Other potential issues include wafer handoff errors and decreased component life due to such movement.

While rapid gross movement may be avoided by limiting the acceleration and speed of the arm, e.g., programmatically or by limiting the power of the drive mechanism, slippage may also occur in such friction- or mechanical-stop-based end effectors due to vibrational inputs to the arm from the drive mechanism and, consequently, the end effector and the wafer. Such vibrations may cause very small, but cyclic, relative motion between the wafer and the end effector. Such repetitive displacements may result in larger overall wafer displacement, and may also result in the generation of particulate contaminants due to rubbing between the wafer and the contact pads.

Figure 5A:
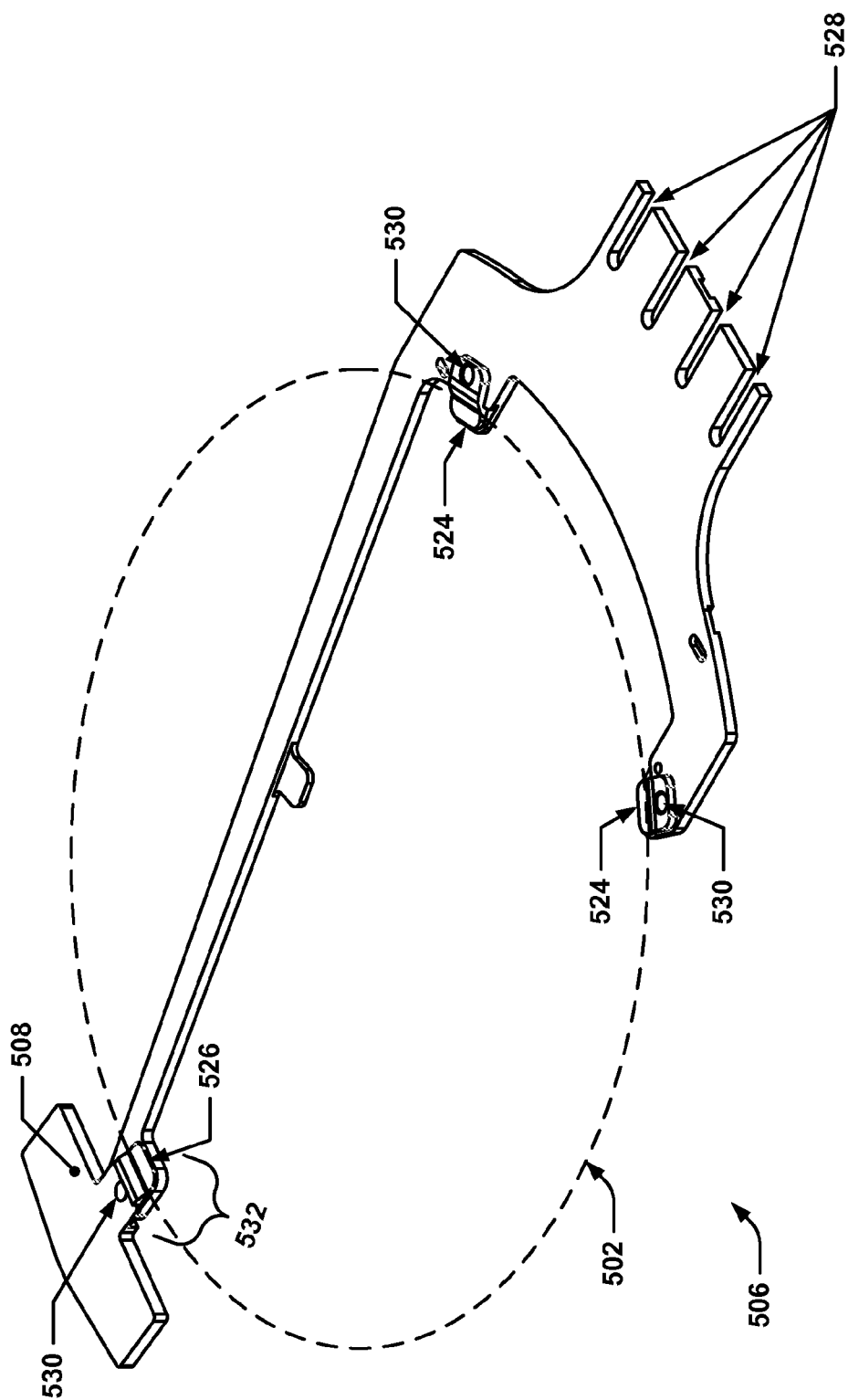
FIG. 5A depicts an isometric view of an end effector with a calibrated mass damper.
Figure 5B:
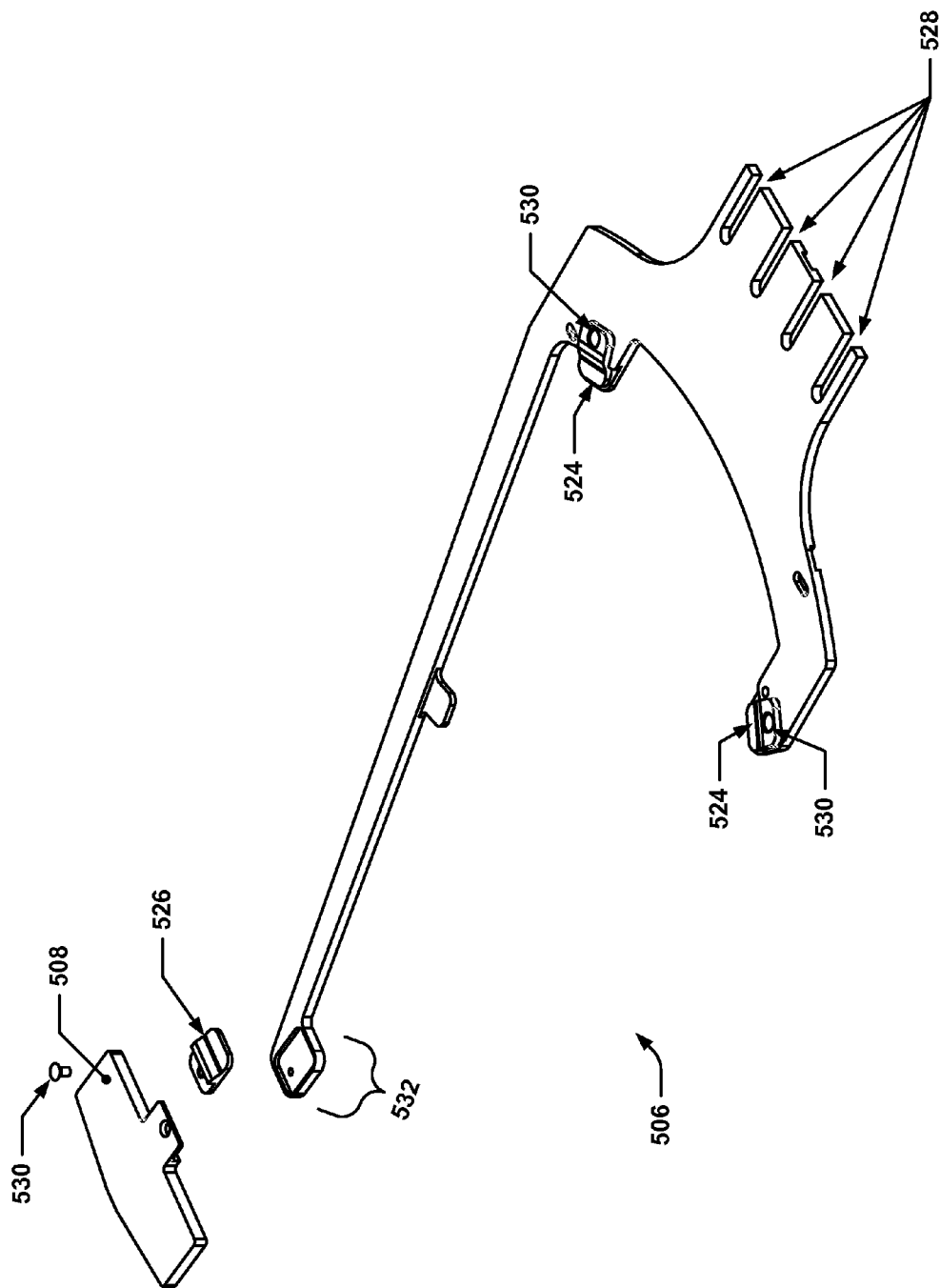
FIG. 5B depicts an isometric view of the end effector of FIG. 5A partially exploded.
Figure 9:
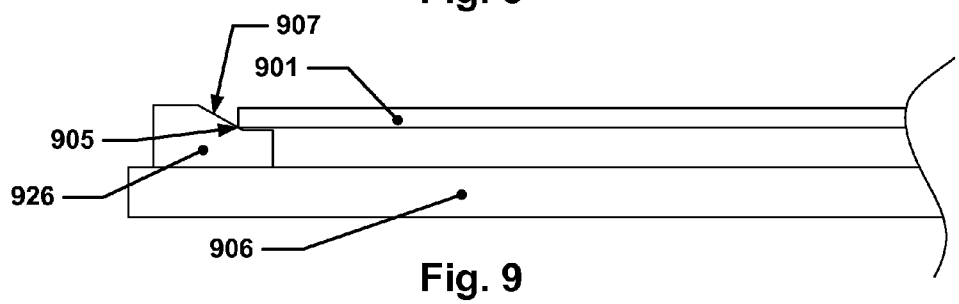
FIG. 9 depicts a side view of an example standard contact pad.
Figure 10:
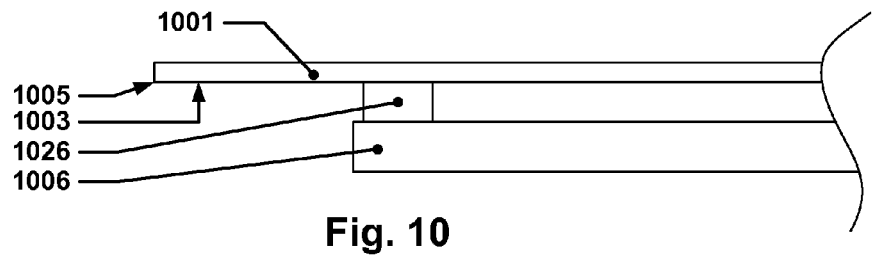
FIG. 10 depicts a side view of an example backside contact pad.

FIG. 5A depicts an end effector 506, which is essentially identical to the end effector 406 in FIG. 4 except that the contact pad 524 at the tip 532 of the end effector 506 has been replaced with a CMD contact pad 526 and a CMD 508 has been added to the assembly. As with FIG. 4, FIG. 5A indicates the edge region of a wafer which may be transported using the end effector 506 by a dashed wafer outline 502. FIG. 5B depicts the end effector 506 with the CMD contact pad 526, the CMD 508, and the screw 530 shown in an exploded view. It is to be understood that different end effector contact pads, and correspondingly different CMD contact pads, may be used on an end effector in different situations. For example, the pads shown in FIGS. 4, 5A, and 5B may be used to handle a wafer's edge, and may be referred to as a standard contact pad herein. FIG. 9 depicts a side view of an example standard contact pad. The standard contact pad 926 may, for example, be supported by an end effector 906 and include an inclined surface 907 which interfaces with the edge 905 of a wafer 901. In some implementations, a backside contact pad may be used instead of a standard contact pad. FIG. 10 depicts a side view of an example backside contact pad. The backside contact pad 1026 may include a raised contact area, e.g., a short post, that protrudes from an upwards-facing surface of end effector 1006 and which contacts the back surface 1003 of the wafer 1026. The backside contact pad configuration may produce a lower chance of particulate contamination since the contact interface is spaced further from the wafer edge 1005 than with a standard contact pad. The CMDs described herein may be used with either type of contact pad, as well as with other contact pad interfaces not explicitly described herein.

A different configuration of contact pad/CMD contact pad may be used to handle a wafer's back side. The CMD 508 may be used with a variety of different contact pads/CMD contact pads.

The CMD 508 may be made of tungsten or other, similar high-density material suitable for use in a semiconductor processing environment. Lower-density materials may be used as well, although such materials may not allow for as compact a CMD form factor and the resulting CMD may therefore mechanically interfere with other components in the processing chamber or load lock. The CMD 508 may also be coated with a protective coating to render the CMD 508 compatible with the process chemistries present in the process chamber, e.g., nickel-plated.

Figure 6A:
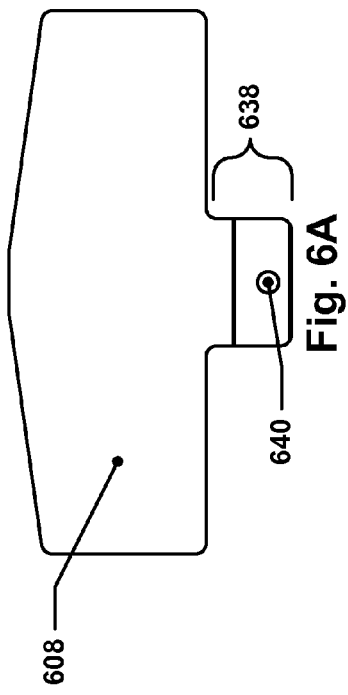
FIGS. 6A-6E depict top, left, front, bottom, and isometric views of a calibrated mass damper.
Figure 6C:
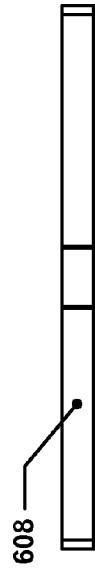
Figure 6E:
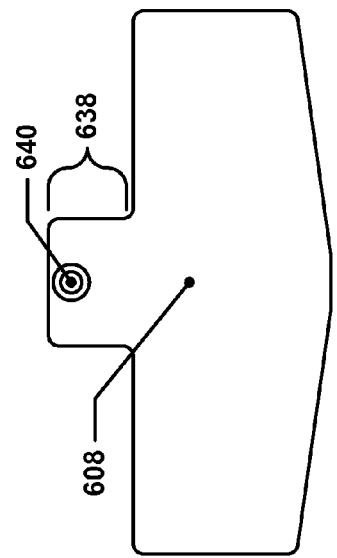
Figure 6B:
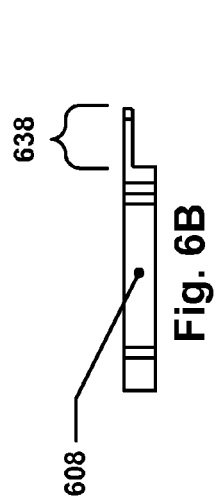
Figure 6D:
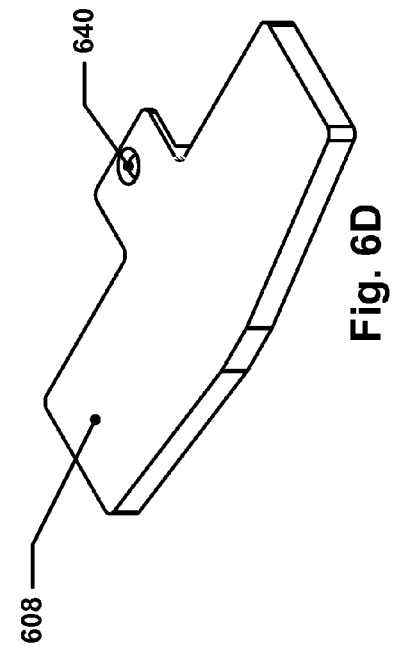

In some implementations, such as for an implementation of an end effector for 300 mm wafers, the CMD 508 may have a mass of approximately 0.38 lbm or greater, e.g., 0.42 or 0.47 lbm. Different types and/or sizes of end effectors may use CMDs with different masses. For example, CMD 608, as shown in the side view of FIG. 6A and the front view 6C, may have a nominal thickness of 0.185" and be generally rectangular in shape, as shown in the bottom and top views 6A and 6E, respectively. FIG. 6D depicts CMD 608 in an isometric view. The overall dimensions of the CMD 608 may be approximately 3.2" along the long axis, and 1.16" along the short axis. A mounting tab 638 may protrude out of one of the long sides of the CMD 608 to allow CMD 608 to be attached to an end effector; the mounting tab 638 may include a mechanical interface 640, such as a hole or other features which facilitate substantially rigid connection of the CMD 608 to an end effector. The mounting tab 638 may protrude approximately 0.5", be 0.75" in width, and may transition to a substantially thinner thickness at some point. The corners on the side of the CMD 608 opposite the side with the tab may be chamfered, for example, with an angle of approximately 8° such that the short sides of CMD 608 may be approximately 1" in length. Sharp edges of the CMD 608 may be rounded, chamfered, or otherwise broken. Other configurations of CMD may be used depending on the configuration of the end effector used. The following discussion presents various insights as to the CMD selection process which may be used to guide CMD design.

As discussed, end effectors which are designed for use within semiconductor process chambers may generally utilize simple handling surfaces, such as contact pads and/or mechanical stops to restrict relative motion between the wafer and the end effector. While relative movement of a wafer with respect to such end effectors due to gross movement may be dealt with by tuning, for example, the motion profile used by the controller for the end effector/arm, the relative motion caused by vibrations imparted to the end effector via the arm and carriage interface may not be so easily dealt with. For example, many common methods for attenuating vibration, such as visco-elastic or constrained layer damping, may not be suitable for use in semiconductor process environments due to the materials used. Vibration-causing mechanical noise may be minimized, e.g., by reducing such noise in the robot drive train or optimizing the robot controller motion profile, but there may be a certain amount of mechanical noise imparted to the robot arm and end effector which cannot feasibly be mitigated by such measures.

Such mechanical noise, when imparted to the end effector, may cause the end effector to experience oscillating bending movement at the first bending mode of the end effector. At the same time, a wafer supported by the end effector may be exposed to similar vibration input and may begin to experience oscillating bending movement at the first bending mode of the wafer. If the first bending modes of the end effector and the wafer are in close proximity, the end effector and wafer bending movements may experience dynamic coupling which amplifies the amount of bending and, consequently, the amount of relative motion between the wafer and the contact pads or other contact interfaces of the end effector.

To mitigate such dynamic coupling, the first bending modes of the wafer and end effector may be adjusted to increase the separation between the first bending modes. A modal separation of approximately at least one octave, i.e. approximately at least one half wavelength, is optimum. The wafer cannot, as a practical matter, be altered since doing so could negatively impact existing process definitions for that particular wafer type, reliability of the semiconductor devices made using such wafers, and the cost of such wafers.

The frequency of the first bending mode of the end effector may be tuned by, for example, changing the stiffness of the end effector. One approach may be to increase the stiffness of the end effector to increase the frequency of the end effector first bending mode until the frequency of the first bending mode of the end effector is greater than the frequency of the first bending mode of the wafer and approximately at least an octave of modal separation exists between the frequencies of the first bending modes of the wafer and the end effector. For example, increasing the thickness of the end effector may increase the bending stiffness and the frequency of the first bending mode. This may, however, not be feasible since the thicker end effector may not be compatible with the clearances required for many semiconductor fabrication modules.

Another approach is to decrease the bending stiffness of the end effector until the frequency of the first bending mode of the end effector is less than the frequency of the first wafer bending mode and approximately at least one octave of frequency separation exists between the first bending modes of the wafer and the end effector. However, decreasing bending stiffness of the end effector may also cause an increase in the bending displacement of the end effector, which may cause the end effector (wafer-loaded and/or unloaded) to no longer clear obstacles which were previously cleared by the end effector. Such mechanical interference is undesirable.

Installing a CMD on the tip of the end effector, as described herein, allows for the frequency of the first bending mode of the end effector to be reduced without reducing end effector bending stiffness and also provides inertial damping which can act to mitigate low-energy mechanical noise. Low-energy mechanical noise is often quite prevalent in the mechanical noise imparted to the end effector by the arm. These aspects of a CMD are discussed further below.

Mass damping may, at a high level, be described as follows. The rigid body response to an applied load is defined as:

$$F_i = m_1 a_1$$

Where $F_i$=input force, $m_1$=rigid body mass, and $a_1$=response acceleration. Increasing the rigid body mass by adding a mass damper to it will result in a smaller response acceleration to the same input force. For example:

$$F_i = (m_1 + m_2) a_2$$

Where $m_1$=initial mass, $m_2$=mass damper, $a_2$=lower response acceleration. To determine the mass damper needed to produce a desired reduction in response acceleration for a given input force, one can substitute the first equation into the section equation:

$$m_1 a_1 = (m_1 + m_2) a_2$$

The response acceleration reduction ratio can thus be rewritten as:

$$\frac{a_2}{a_1} = \frac{m_1}{(m_1 + m_2)}$$

Thus, to decrease the response acceleration for a given input force by 25%, the mass damper used would need to be 33% of the rigid body mass. For example, a standard end effector may weigh approximately 0.3 lbm. The standard end effector may then be augmented with a 0.5 lbm CMD. The simplified response acceleration reduction ratio may therefore be approximately 38%, i.e., the amount of response acceleration would be reduced by 62%. As indicated above, this is a high-level discussion, and does not address other factors which may impact the response acceleration, such as mechanical amplification effects due to vibration.

Vibration isolation associated with a CMD may be viewed, at a simplified, high-level, as a single-degree-of-freedom approximation with base input, which may be characterized as having a dynamic gain factor of:

$$Q = \frac{X}{A} = \frac{\sqrt{1 + \left(\frac{2\zeta\omega}{\omega_n}\right)^2}}{\sqrt{\left(1 - \left(\frac{\omega}{\omega_n}\right)^2\right)^2 + \left(\frac{2\zeta\omega}{\omega_n}\right)^2}}$$

Where Q=dynamic gain factor, X=dynamic output, A=dynamic input, ω=frequency of the wafer first bending mode, $\omega_n$=frequency of the end effector first bending mode, and =critical damping ratio. In the scenario where $\omega=\omega_n$, i.e., the wafer and the end effector both have the same first bending mode frequency (the end effector/wafer system is in a resonance condition), this reduces to: Q~½ζ. When the resonant frequencies are separated, however, the response is reduced from this value. For example, when $\omega=2\omega_n$, which is one octave of first bending mode frequency separation:

$$Q = \sqrt{\frac{1 + 16\zeta^2}{9 + 16\zeta^2}}$$

Critical damping ratios for end effector systems typically used in semiconductor fabrication systems may generally be less than about 0.1. A target frequency separation of one octave, as discussed above, may allow for a dynamic gain reduction of greater than 90%, which may significantly reduce the amount of vibration experienced by the end effector/wafer system. For example, using a critical damping ratio of 0.1, the dynamic gain factor at resonance ($\omega=\omega_n$), using the above simplified model, has a value of 5. However, if one octave of frequency separation ($\omega=2\omega_n$) is introduced between the first bending modes of the wafer and the end effector, the dynamic gain factor drops to a value of 0.33, which is greater than a 93% reduction in gain factor. It is to be understood that, as a practical matter, the frequency of the wafer first bending mode will end up being the higher of the two first bending mode frequencies since adding a calibrated mass damper can only reduce the first bending mode of the end effector.

Finite element analysis and laboratory testing may be used to further refine the various parameters of a CMD, although the high-level approach discussed above may be used to generally define CMD parameters. Furthermore, while mass damping and vibration isolation may both drive design of a CMD, a CMD's design may be governed primarily by the degree of vibration isolation desired. For example, a CMD may be designed to produce a desired level of vibration isolation and the resulting mass damping may not be a design driver, but a beneficial side effect of such vibration isolation tuning. Alternatively, if a particular amount of mass damping is also desired, a CMD may be designed to produce at least the desired level of vibration isolation and the desired level of mass damping. For example, if a CMD of 0.4 lbm yields the desired vibration isolation performance but a 0.5 lbm CMD is needed to provide the desired degree of mass damping, the CMD may be designed to the 0.5 lbm target. This will provide the desired degree of mass damping and provide vibrational isolation beyond the minimum desired vibration isolation.

The various parameters discussed above may differ from end effector design to end effector design, and from wafer type to wafer type. The basic techniques outlined above may, however, be used to determine appropriate CMDs for other implementations as well. For example, a 300 mm wafer may have a first bending mode of approximately 21 Hz and an end effector configured to handle a 300 mm wafer may have a first bending mode of approximately 16 Hz, which may, using a target of at least one octave of frequency separation, dictate that the end effector have a first bending mode of approximately 10.5 Hz or less. A 200 mm or a 450 mm wafer, however, may have different first bending modes than a 300 mm wafer, and the end effectors sized to handle such wafers may have different first bending modes than an end effector sized to handle 300 mm wafers. A particular wafer may also have different first bending mode frequencies depending on how it is supported. For example, an edge-supported 300 mm wafer may have a different first bending mode frequency than a backside-supported 300 mm wafer of the same type. Similarly, a wafer which is supported on one pair of generally opposite edges, such as the wafer 102 shown in FIG. 1A, may have a first bending mode frequency which is different from a wafer which is supported on two pairs of generally opposite edges.

It is also to be understood that while the discussion above has focused on a frequency separation of one octave, greater separations may also be used. It is to be further understood that while discussion above has also focused on a critical damping ratio of 0.1 or less, some end effector systems in which a CMD may be used may feature critical damping ratios of greater than 0.1. Such implementations are also to be understood as being within the scope of this disclosure. In general, larger frequency separations will provide better vibration reduction, and more vibration reduction will be possible in systems with lower critical damping ratios.

End effectors without CMDs, such as end effector 406 in FIG. 4, may currently be in use in a large number of existing semiconductor fabrication tool installations. In one implementation, the CMD may be provided as part of a retrofit kit which may be installed on a CMD-less end effector to convert it into an end effector featuring a CMD. Such kits may, in barest form, include only a CMD calibrated for a particular type or range of end effectors. The CMD may be attached to the end effector using hardware which is already present in the end effector.

In other retrofit kit implementations, the kit may include a CMD and custom hardware configured to facilitate attachment of the CMD to the end effector. For example, such custom hardware may take the form of a CMD contact pad which is used to replace an existing contact pad located at the tip of the end effector. The CMD contact pad may include features identical to features on the original contact pad in the region where the contact pads interface with the end effector, such as, for example, a rectangular base with rounded corners and a mounting hole which aligns with a threaded hole on the end effector. The CMD contact pad may also include features identical to the original contact pad in the portion of the CMD contact pad which will contact the wafer. The CMD contact pad may, however, also include features which are used to mechanically interface with the CMD but which are not present on the original contact pad. For example, the CMD may be equipped with a thin tab featuring a hole; the tab may be placed over the CMD pad and a single screw may be inserted through the tab hole and the CMD contact pad hole and threaded into the end effector, securing all three components to one another. To prevent the overall height of the CMD contact pad/end effector assembly from exceeding the original contact pad/end effector assembly, the CMD contact pad may feature a recessed area which receives the CMD tab. The original contact pad may not have such a feature.

Figure 11:
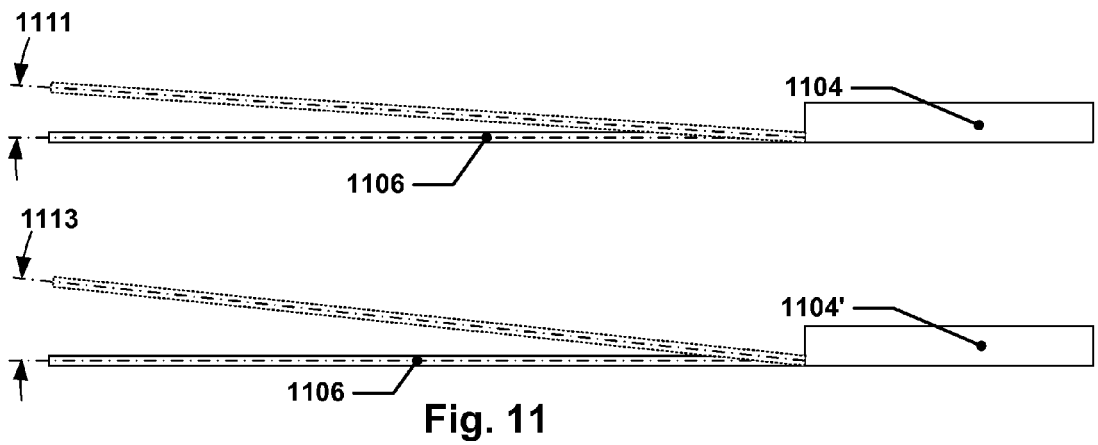
FIG. 11 depicts arms with two different amounts of pitch adjustment for end effectors attached to the arms.

In a third retrofit implementation, the kit may include a CMD (and custom hardware configured to facilitate attachment of the CMD to the end effector, if needed), as described above, but may also include a custom arm configured to attach to the end effector using an end effector clamp. The custom arm may replace an existing arm. Both the existing arm and the custom arm may include features which allow for the pitch of an attached end effector to be adjusted to align the end effector with, for example, the plane of a wafer supported by the lift pins of a pedestal. A certain amount of pitch adjustment may be built into the existing arm, but the built-in pitch adjustment in the existing arm may not be sufficient to overcome the displacement effects of additional bending in the end effector due to the added weight of the CMD. The custom arm allows for additional pitch adjustment beyond that supplied by the existing arm which may be needed to offset the increased pitch deflection due to the added weight of the CMD. FIG. 11 depicts arms with two different amounts of pitch adjustment for an end effector attached to the arm. For example, arm 1104 may be an arm that supports an end effector 1106 and provides a first range of pitch adjustment 1111. A custom/replacement arm 1104' may be provided that is essentially the same as the existing arm 1104 except that it has a larger range of pitch adjustment 1113. Alternatively, if pitch adjustment is built into some other part, a custom replacement for that other part may be included in the retrofit kit to provide increased or shifted pitch adjustment.

The above-described kits may also, if needed, include standard or custom fasteners which may be used to interface the fastener interface features on the end effector or other components. In some implementations, different CMD contact pads may be used with the same CMD. For example, different CMD contact pads may be required depending on whether the edges or the backside of the wafer is to be contacted. The same CMD, however, may be used with either, assuming that the wafer first bending mode frequencies are the same or result in the desired at least one octave of frequency separation. A retrofit kit may be specific to one particular type of contact pad, or may include CMD contact pads for multiple types of contact interfaces.

CMDs are not limited to retrofit applications. An end effector may also be produced with a built-in or pre-installed CMD. In such end effectors, the CMD may be very similar to the implementations described above with respect to the retrofit kits, although, since pre-existing features of existing end effectors do not need to be accommodated, the particulars of the interface used to join the CMD to the end effector may be different.

For various reasons, it may be preferable to manufacture the end effector and the CMD as separate parts and then mechanically join them during an assembly process. For example, it may be desirable to make an end effector from an easily-machinable, lightweight material such as aluminum. However, it may also be desirable to use a very dense material, such as tungsten, to make the CMD. Due to the different materials used to make each part, the two parts would need to be made separate and joined later. Mechanical fastening systems, such as those suitable for retrofit applications, may be used to join the parts. However, other techniques may be used as well which may not be feasible in the retrofit context, such as soldering or diffusion bonding the two parts together.

Figure 8:
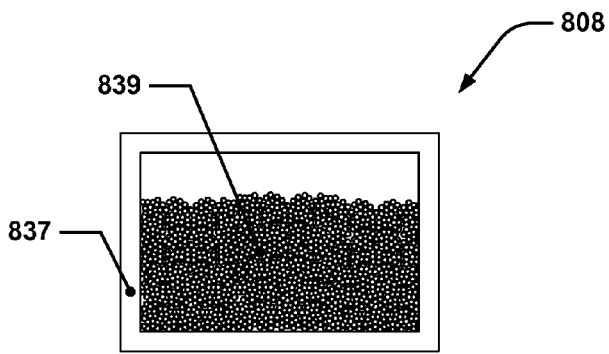
FIG. 8 depicts an unscaled cross-section of a housing of one material containing granules or particles of another material.

Another implementation of a CMD may involve a CMD which uses different materials. For example, the CMD may feature a housing made of one material, such as aluminum, and a calibrated mass made of another material, such as tungsten. The housing may be engineered to be very lightweight, e.g., by having very thin walls. The housing and end effector may even be made from the same piece of material. The calibrated mass may be placed inside the housing, and the housing may then be sealed to prevent the calibrated mass from escaping. For example, in some implementations, powdered tungsten particles may be used to supply the calibrated mass. The use of tungsten particles allows for very precise definition of the calibrated mass, but presents a potential for particulate contamination within the semiconductor fabrication process. However, if the particles are contained within the housing and the housing is sealed prior to installation in a semiconductor fabrication apparatus, the potential for tungsten particle contamination is eliminated, at least as long as the integrity of the housing is preserved. The use of particles may also result in additional vibration damping due to the energy which may be dissipated due to relative motion of the particles with respect to each other. FIG. 8 depicts an unscaled cross-section of a housing of one material containing granules or particles of another material. As discussed above, a CMD 808 may include a housing 837 made out of one material, e.g., aluminum, that may contain particles or granules 839 of another material, e.g., tungsten, that are sealed within the housing 837.

The end effectors described herein have generally been of the type used in uniaxial linear transfer robot arms. However, the CMDs described herein may also be used with end effectors for other types of robot arms. For example, a CMD may be used on an end effector for an R-theta robot arm, which is capable of rotational movement as well as linear translation. It is to be understood that such CMD applications are also within the scope of this disclosure.

It is also to be understood that while the CMDs discussed herein have been mounted to the tip of an end effector, and have been sized accordingly, other implementations of CMDs may involve locating the CMD elsewhere on the end effector and may involve CMDs which are sized based on the dynamics associated with the non-tip mounting location. Such CMDs may, nonetheless, be sized to satisfy the same general principles outlined above, e.g., resulting in approximately an octave or more of frequency separation between the first bending modes of the CMD-equipped end effector and the wafer. Such implementations should also be understood to be within the scope of this disclosure.

Figure 7:
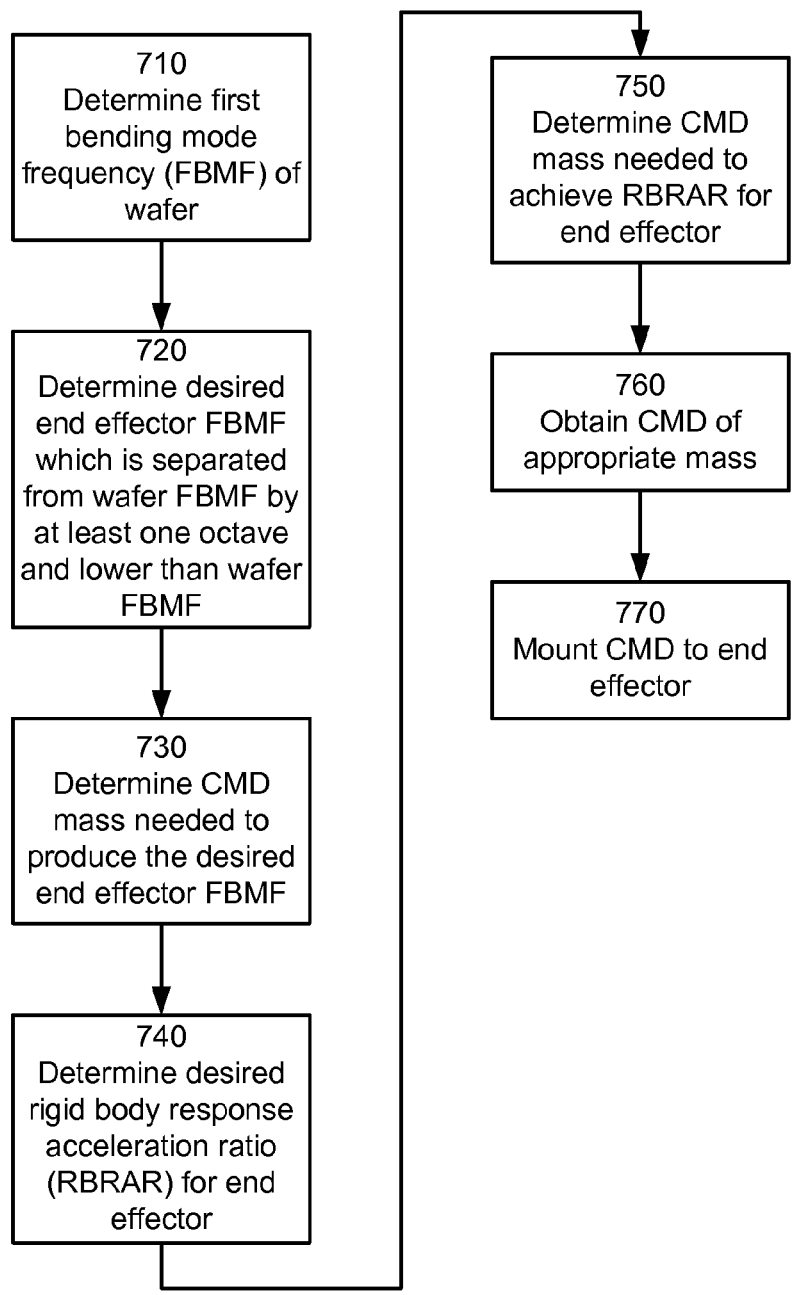
FIG. 7 depicts a flowchart of a CMD implementation process.

FIG. 7 depicts a flowchart of a CMD implementation process for an end effector configured to transport a wafer. In block 710, the first bending mode frequency for the wafer, as supported by the end effector, is determined. This may be done experimentally, or calculated using finite element techniques or simplified physical models. After determining the first bending mode frequency of the wafer, a desired end effector first bending mode frequency is determined in block 720 which is lower than the wafer first bending mode frequency and which is separated from the wafer first bending mode frequency by at least one octave.

In block 730, a CMD mass is calculated. The CMD mass is calculated to produce the desired end effector first bending mode frequency. Techniques such as those discussed above may be used, including finite element methods. Experimental techniques may also be used.

In block 740, a desired rigid body response acceleration ratio may be determined. In block 750, a CMD mass needed to achieve the desired rigid body response acceleration ratio may be calculated. Blocks 740 and 750 may be skipped if the rigid body response acceleration ratio is not a design driver, i.e., reducing the rigid body response acceleration ratio is not required, but is instead an incident benefit.

In block 760, a CMD of appropriate mass may be obtained. This mass may, for example, be the higher of the CMD masses calculated to produce the desired first bending mode frequency and the desired rigid body response acceleration ratio. In some implementations, the CMD mass may be the CMD mass calculated to produce the desired first bending mode frequency. For example, an appropriately-sized CMD may be manufactured such that it has the desired mass. Alternatively, an appropriately-sized CMD may be selected from a range of available CMD sizes. In block 780, the obtained CMD may be installed on an end effector and used to handle wafers.

The technique outlined in FIG. 7 may be performed in partial form. For example, blocks 710 through 770 may be performed by a manufacturer of wafer handling systems, and the resulting CMD may then be provided to operators of wafer handling systems. Thus, it is not required that all actions represented by blocks 710 through 770 be performed by one entity, and the technique described in FIG. 7 may also be partially performed. In another example, an operator of a wafer handling system may obtain a CMD sized for use with a particular end effector and may then mount that CMD to the end effector, which may result in the end effector's first bending mode frequency being reduced such that more than one octave of frequency separation exists between the wafer first bending mode and the end effector first bending mode. Such actions may also be considered to be part of the techniques described herein.

While the CMDs discussed herein have been developed for the purpose of reducing reduce rigid body acceleration response in order to reduce potential damage to the wafer and particulate contamination within a vacuum or low-pressure environment, similar techniques and CMDs may be used to minimize visible rigid body displacement response. From a wafer health standpoint, this may be of little value since such displacements may be few in number. However, visible displacement may be observable by the personnel using the equipment and may be perceived as undesirable. A CMD may provide a cost-effective way to mitigate such behavior.

To provide a CMD engineered to mitigate rigid body displacement response, the mass may be calibrated according to:

$$m_2 = \frac{F_i}{\delta \omega^2} - m_1$$

Where $m_1$=end effector mass without CMD, $m_2$=CMD mass, $F_i$=input force, $\delta$=desired maximum displacement, and $\omega$=angular frequency of response vibration.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper. End effectors and CMDs such as those described herein may be used to move a substrate from one tool to another, thus facilitating fabrication processes. The end effectors and CMDs described herein may be used with any of a variety of different semiconductor fabrication systems, including deposition, etch, cure, heat treatment, and other tools used in semiconductor wafer processing.

It will also be understood that unless features in any of the particular described implementations are expressly identified as incompatible with one another or the surrounding context implies that they are mutually exclusive and not readily combinable in a complementary and/or supportive sense, the totality of this disclosure contemplates and envisions that specific features of those complementary implementations can be selectively combined to provide one or more comprehensive, but slightly different, technical solutions. It will therefore be further appreciated that the above description has been given by way of example only and that modifications in detail may be made within the scope of the invention.

What is claimed is:

1. A device comprising:
  a mechanical interface configured to rigidly connect to an end effector of a wafer handling robot, the end effector:
    having an interface portion configured to connect the end effector to the wafer handling robot,
    having a thin finger extending away from the interface portion, and
    configured to support a wafer such that the finger is disposed underneath the wafer; and
  a calibrated mass damper (CMD), wherein:
    the mechanical interface is configured to attach the CMD to a tip of the finger opposite the interface portion,
    the CMD is greater than or equal to one-half pound-mass, and
    the CMD is calibrated to produce at least one octave of separation between a first modal frequency of the end effector and a first modal frequency of the wafer that the end effector is configured to support.

2. The device of claim 1, wherein the CMD is approximately one-half pound-mass.

3. The device of claim 1, wherein the CMD is made from tungsten.

4. The device of claim 1, wherein the CMD is nickel-plated.

5. The device of claim 1, wherein:
  the end effector has a first length in a direction corresponding to a largest dimension of the end effector,
  the CMD and the end effector, when the CMD is installed on the end effector, have a combined second length in the direction corresponding to the largest dimension of the end effector, and
  the second length does not exceed the first length by more than 1.35 inches.

6. The device of claim 1, wherein the CMD includes a housing and a calibration material, wherein:
  the calibration material is sealed inside the housing, and
  the calibration material is granulated.

7. An end effector retrofit kit, the end effector retrofit kit comprising:
  a calibrated mass damper (CMD), wherein:
    the CMD includes a mechanical interface configured to rigidly connect to an end effector of a wafer handling robot, the end effector:
      having an interface portion configured to connect the end effector to the wafer handling robot,
      having a thin finger extending away from the interface portion, and
      configured to support a wafer such that the finger is disposed underneath the wafer, wherein the finger has a tip portion located on an opposite end of the finger from the interface portion and the mechanical interface portion of the CMD is configured to rigidly connect to the end effector by connecting to the tip portion;

the CMD is greater than or equal to one-half pound-mass; and the CMD is calibrated to produce at least one octave of separation between a first modal frequency of the end effector and a first modal frequency of the wafer that the end effector is configured to support.

8. The end effector retrofit kit of claim 7, further comprising:
a standard CMD contact pad, wherein:
the end effector includes one or more standard contact pads,
the standard CMD contact pad includes a subset of the features of the standard contact pad,
the standard CMD contact pad includes additional features configured to interface with and support the CMD, and
the standard CMD contact pad is configured to replace one of the standard contact pads of the end effector during retrofit.

9. The end effector retrofit kit of claim 7, further comprising:
a backside CMD contact pad, wherein:
the end effector includes one or more backside contact pads,
the backside CMD contact pad includes a subset of the features of the backside contact pad,
the backside CMD contact pad includes additional features configured to interface with and support the CMD, and
the backside CMD contact pad is configured to replace one of the backside contact pads of the end effector during retrofit.

10. The end effector retrofit kit of claim 7, further comprising:
a modified arm, wherein:
the modified arm is configured to replace an existing arm of the wafer handling robot during retrofit,
the existing arm permits a first level of pitch adjustment for the end effector, and
the modified arm includes features configured to:
rigidly interface with mating features on the end effector,
rigidly interface with mating features on a carriage of the robot, and
permit a second level of pitch adjustment for the end effector which is greater than the first level of pitch adjustment provided by the existing arm.

11. The end effector retrofit kit of claim 7, wherein the CMD is approximately one-half pound-mass.

12. The end effector retrofit kit of claim 7, wherein the CMD is made from tungsten.

13. The end effector retrofit kit of claim 7, wherein the CMD is nickel-plated.

14. The end effector retrofit kit of claim 7, wherein:
the end effector has a first length in a direction corresponding to a largest dimension of the end effector,
the CMD and the end effector, when the CMD is installed on the end effector, have a combined second length in the direction corresponding to the largest dimension of the end effector, and
the second length does not exceed the first length by more than 1.35 inches.

15. The end effector retrofit kit of claim 7, wherein the CMD includes a housing and a calibration material, wherein:
the calibration material is sealed inside the housing, and
the calibration material is granulated.

16. An end effector, the end effector comprising:
a mechanical interface portion, a first side of the mechanical interface portion configured to rigidly connect to an arm of a wafer handling robot;
a finger portion, the finger portion extending from the mechanical interface portion in a direction generally opposed to the first side;
a tip, the tip located at an end of the finger portion opposite the mechanical interface portion, wherein the end effector is configured to support a semiconductor wafer during wafer transfer operations such that the finger portion is disposed underneath the wafer; and
a calibrated mass damper (CMD), wherein:
the CMD is proximate to the tip,
the CMD is greater than or equal to one-half pound-mass, and
the CMD is calibrated to produce at least one octave of separation between a first modal frequency of the end effector and a first modal frequency of the semiconductor wafer.

17. The end effector of claim 16, wherein the CMD is approximately one-half pound-mass.

18. The end effector of claim 16, wherein the CMD is made from tungsten.

19. The end effector of claim 16, wherein the CMD is nickel-plated.

* * * * *